(12) United States Patent
Henry (10) Patent No.: US 6,208,272 B1
(45) Date of Patent: Mar. 27, 2001

(54) DECODING OF A QUANTIZED DIGITAL SIGNAL

(75) Inventor: Félix Henry, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/326,532

(22) Filed: Jun. 7, 1999

(30) Foreign Application Priority Data

Jun. 22, 1998 (FR) .................................................. 98-07830

(51) Int. Cl.[7] .................................................. H03M 7/34
(52) U.S. Cl. .................................. 341/51; 341/65; 341/67
(58) Field of Search .............................. 341/51, 65, 67, 341/107

(56) References Cited

U.S. PATENT DOCUMENTS 5,585,852 * 12/1996 Agarwal ................................. 348/398
5,682,462 * 10/1997 Huang et al. ........................ 395/2.28

OTHER PUBLICATIONS

Gersho et Al.: "Vector Quantization and Signal Compression", 1991, Klumer, Boston, pp. 352–355.
Nakai et Al.: "A Fast VQ Codebook Design Algorithm for a Large Number of Data", Icassp 1992, vol. 1, Mar. 23–26 1992, pp. 109–122.
Andrew, L. "A Unified Approach to Selecting Optimal Step Lengths for Adaptive Vector Quantizers" IEEE Transactions on Communications, vol. 44, No. 4, April 1996, pp. 434–439.

A. Gersho, et al., "Vector Quantization and Signal Compression", Klumer Academic Publishers, Boston, MA, 1992, pp. 173–185.

* cited by examiner

*Primary Examiner*—Michael Tokar
*Assistant Examiner*—Anh Tran
(74) *Attorney, Agent, or Firm*—Fitzpatrick, Cella, Harper & Scinto (57) ABSTRACT

A method and apparatus for decoding a quantized digital signal. Quantization symbols are read and an experimental distribution of the quantization symbols is constructed. An experimental distribution is approximated by means of a continuous distribution model which passes through values of the experimental distribution. A dequantization vector, for at least one quantization cell, equal to the center of mass of the points of the quantization cell weighted by the values of the restricted continuous distribution is calculated. The dequantization vectors associated respectively with the quantization symbols are then stored for use in decoding.

15 Claims, 6 Drawing Sheets

DECODING OF A QUANTIZED DIGITAL SIGNAL

BACKGROUND OF THE INVENTION

The present invention concerns a method and device for decoding a coded digital signal, and more particularly a method and device for decoding a digital signal which was quantized during coding.

The coding of a digital signal is normally used for reducing the transmission time for this signal or to reduce the space required for storing such a digital signal. The decoding makes it possible to reconstitute, in order to use it, a digital signal which was previously coded.

The present invention concerns the decoding of digital signals coded by methods of compressing digital signals with loss, and is particularly related to compression methods in which quantization methods are used.

Quantization techniques make it possible, in a known fashion, to transform a continuous signal into a discrete signal, or to transform one discrete signal into another discrete signal which is less finely represented.

Such a quantization of the digital signal makes it possible to represent the signal by means of a finite number of bits; the larger the quantization step (in scalar quantization) or the smaller the dictionary (in vector quantization), the smaller the number of bits.

It is clear that, the larger the size of the quantization cells in which all the vectors of the signal are coded by the same quantization symbol, the greater the compression of the signal whilst, the smaller the size of the quantization cells, the smaller the distortion appearing on decoding.

Known techniques of dequantizing a coded signal are described in the book entitled "Vector Quantization and Signal Compression" by A. Gersho et R. M. Gray, published by Kluwer Academic Publishers, Boston, Mass., 1992, pages 173–185. These techniques use the centre of the quantization cell as the dequantization vector, or restoration level.

SUMMARY OF THE INVENTION

The object of the present invention is to improve the ratio of compression to distortion when decoding a quantized digital signal, and notably to reduce the distortion caused during the dequantization of the signal.

The method of decoding a digital signal to which the invention relates applies to a coded signal quantized by means of quantization symbols associated respectively with quantization cells.

According to the invention, this decoding method is characterised in that it includes the following steps:
  reading the quantization symbols;
  constructing an experimental distribution of the quantization symbols on the quantization cells by calculating the number of occurrences of the said quantization symbols in the coded signal;
  approximating the said experimental distribution by means of a continuous distribution model, the continuous distribution model passing through values of the experimental distribution;
  calculating, for at least one quantization cell, a dequantization vector equal to the centre of mass of the points of the said quantization cell weighted by the values of the continuous distribution restricted to the said quantization cell;
  storing the dequantization vectors associated respectively with the quantization symbols; and
  dequantizing the coded signal, representing each vector of the signal by means of a dequantization vector associated with the quantization signal received.

The decoding method according to the invention makes it possible, by virtue of the estimation of the distribution of the signal within each quantization cell, to calculate an optimum dequantization vector, equal to the centre of mass of the points of each quantization cell weighted by the values of the estimated distribution on this quantization cell. This optimum quantization vector is closer to the mean value of the digital signal before coding than the centre of the quantization cell used in the conventional decoding methods.

The distortion caused during the decoding of the digital signal is consequently reduced, the decoding method according to the invention thus making it possible to increase the ratio of compression to distortion.

According to a preferred characteristic of the invention, which makes it possible to improve the approximation, the continuous distribution model passes through the values of the experimental distribution at the centre of each quantization cell.

According to a preferred version of the invention, the decoding method according to the invention also includes the following steps:
  comparing the number of occurrences of the quantization symbols with a threshold value;
  calculating, for the quantization cells in which the number of occurrences of the said quantization symbol is greater than the said threshold value, a dequantization vector equal to the centre of mass of the points of the said quantization cell weighted by the values of the continuous distribution restricted to the said quantization cell;
  allocating, for the quantization cells in which the number of occurrences of the said quantization symbol is less than the said threshold value, a dequantization vector equal to the centre of the said quantization cell;
  storing the dequantization vectors associated respectively with the dequantization symbols; and
  dequantizating the coded signal, representing each vector of the signal by the dequantization vector associated with the quantization symbol received.

The decoding method thus makes it possible, for the quantization cells in which the values of the experimental distribution are low and are not sufficiently representative to effect a good approximation of the distribution of these cells, to use, as dequantization vectors, the centre respectively of these quantization cells.

According to an advantageous version of the invention, and in order to facilitate the calculations, the continuous distribution model is a real function with N variables, N being equal to the dimension of the quantization space.

In particular, the continuous distribution model is a linear function by pieces when the dimension of the quantization space is equal to one and is a plane function by pieces when the dimension of the quantization space is equal to two.

Correlatively, the invention proposes a device for decoding a coded digital signal, the said coded signal being quantized by means of quantization symbols associated respectively with quantization cells, characterised in that it has:
  means of storing the form of the quantization cells;
  means of reading the quantization symbols;

means of constructing an experimental distribution of the quantization symbols on the quantization cells by calculating the number of occurrences of the said quantization symbols in the coded signal;

means of approximating the said experimental distribution by means of a continuous distribution model, the continuous distribution model passing through values of the experimental distribution;

means of calculating a dequantization vector equal to the centre of mass of the points of the said quantization cell weighted by the values of the continuous distribution restricted to the said quantization cell;

means of storing the dequantization vectors associated respectively with the quantization symbols; and means of dequantizing the coded signal, adapted to represent each vector of the signal by means of a dequantization vector associated with the quantization signal received.

This decoding device has advantages similar to those of the method according to the invention and thus makes it possible to improve the ratio of compression to distortion in the devices for compressing and decompressing digital signals with loss.

According to a preferred version of the invention, which makes it possible to reduce still further the distortion caused on decoding, notably for weakly represented quantization cells, the decoding device also has:

means of comparing the number of occurrences of the said quantization symbols with a threshold value, the said calculation means being adapted to calculate a dequantization vector equal to the centre of mass of the points of a quantization cell weighted by the values, of the continuous distribution restricted to the quantization cell for the quantization cells in which the number of occurrences of the quantization symbol is greater than the said threshold value; and allocation means adapted to associate, with the quantization symbols for which the number of occurrences of the said quantization symbol is less than the said threshold value, a dequantization vector equal to the centre of the quantization cell.

The invention also concerns an appliance for processing a digital signal having means adapted to implement the decoding method according to the invention, or having a decoding device according to the invention, thus exhibiting a high ratio of compression to distortion.

This appliance for processing a digital signal can be a digital camera, a database management system, or a computer.

An information storage means which can be read by a computer or by a microprocessor, integrated or not into the decoding device, optionally removable, stores a program implementing the decoding method.

Other characteristics and advantages of the invention will also appear in the following description.

BRIEF DESCRIPTION OF THE DRAWINGS

In the accompanying drawings, given by way of non-limitative examples.

DETAILED DESCRIPTION

Figure 1:
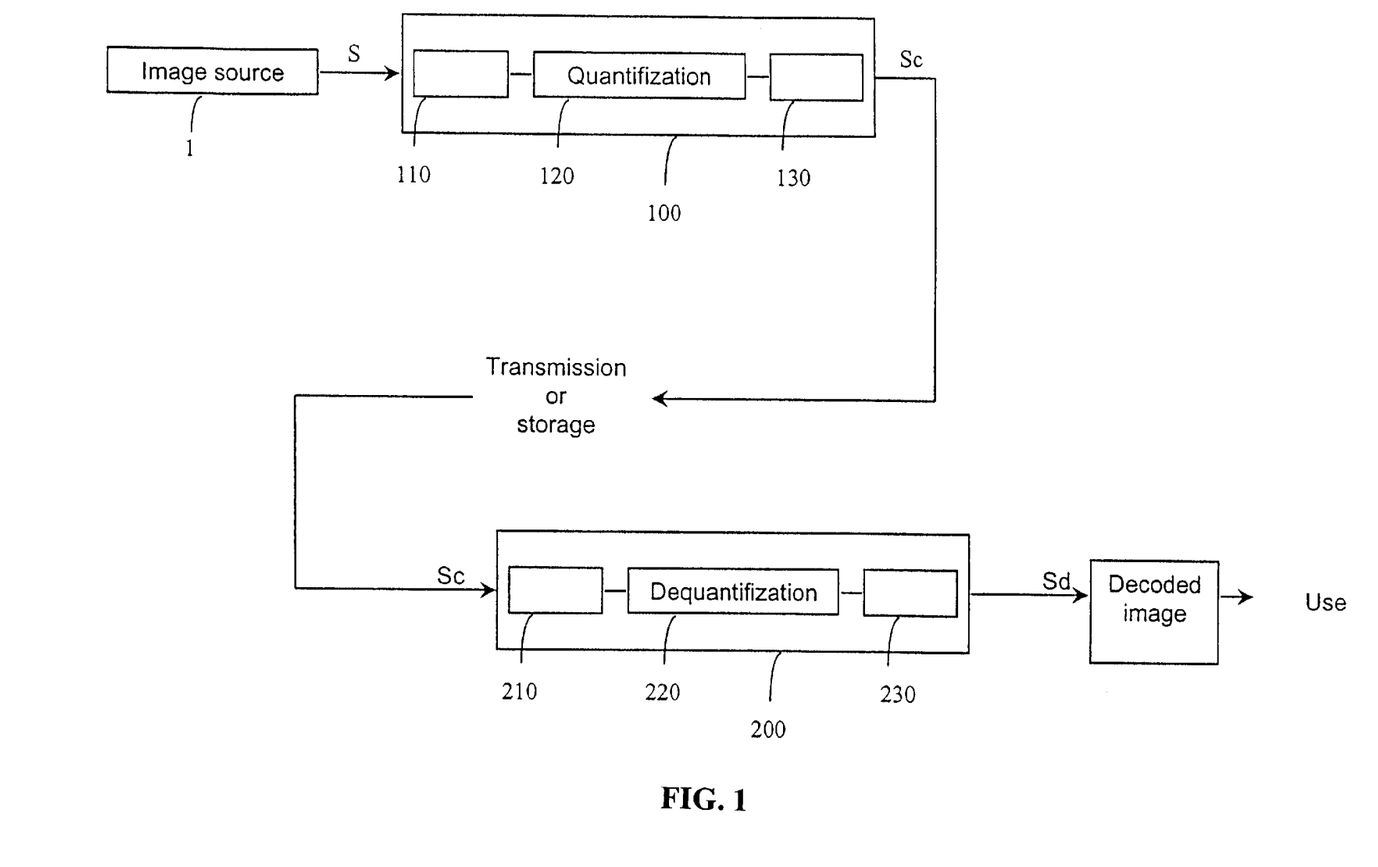
FIG. 1 is a block diagram illustrating a device for processing a digital signal.

As illustrated in a general fashion in FIG. 1, a decoding device 200 according to the invention is associated with a device 100 for coding a digital signal S which is adapted to code the digital signal S with a view to compressing it.

In this particular example, the digital signal to be coded S is a series of digital samples for sending an image, for example octets. Each octet value represents a pixel of the grey-level image (black and white image) or of a colour image.

An image source I generates a series of digital samples representing an image which it is wished to transmit or store. The digital signal S is supplied at the input of the compression circuit. It consists of a series of digital words, for example octets, each octet representing a pixel of the image to be coded.

The device 100 for coding the digital signal S has, by way of non-limitative example, transformation means 110 adapted to transform the received signal S in order to break down the signal into a sum of known functions. The digital signal S can be transformed by means of a conventional set of filters. Reference can advantageously be made to the French patent application No 98 052 47 in the name of the Applicant, the content of which is integrated by reference into this description with regard to the details of the implementation of a transformation of the digital signal S into sub-bands.

Quantization means 120 are then provided for quantizing the digital signal S in the form of discrete values: on each quantization cell $C_i$, corresponding to a related part of the space to be quantized, all the vectors of the signal S to be quantized are coded by means of the same quantization symbol $q_i$.

Entropic coding means 130 next make it possible to compress the quantized signal without loss, by means of an arithmetic coding for example, or a Huffman coding.

The digital signal thus coded Sc is transmitted or stored with a view to subsequent use.

When the signal Sc is decoded, it is received by the decoding device 200, which has in succession, and solely by way of example, entropic decoding means 210, dequantization means 220 and transformation means 230 adapted to perform, on the dequantized signal, a transformation which is the reverse of that implemented by the transformation means 110 when the digital signal S is coded.

The signal thus decoded Sd makes it possible to reconstitute a decoded image, which is then used, and for example displayed.

Figure 2:
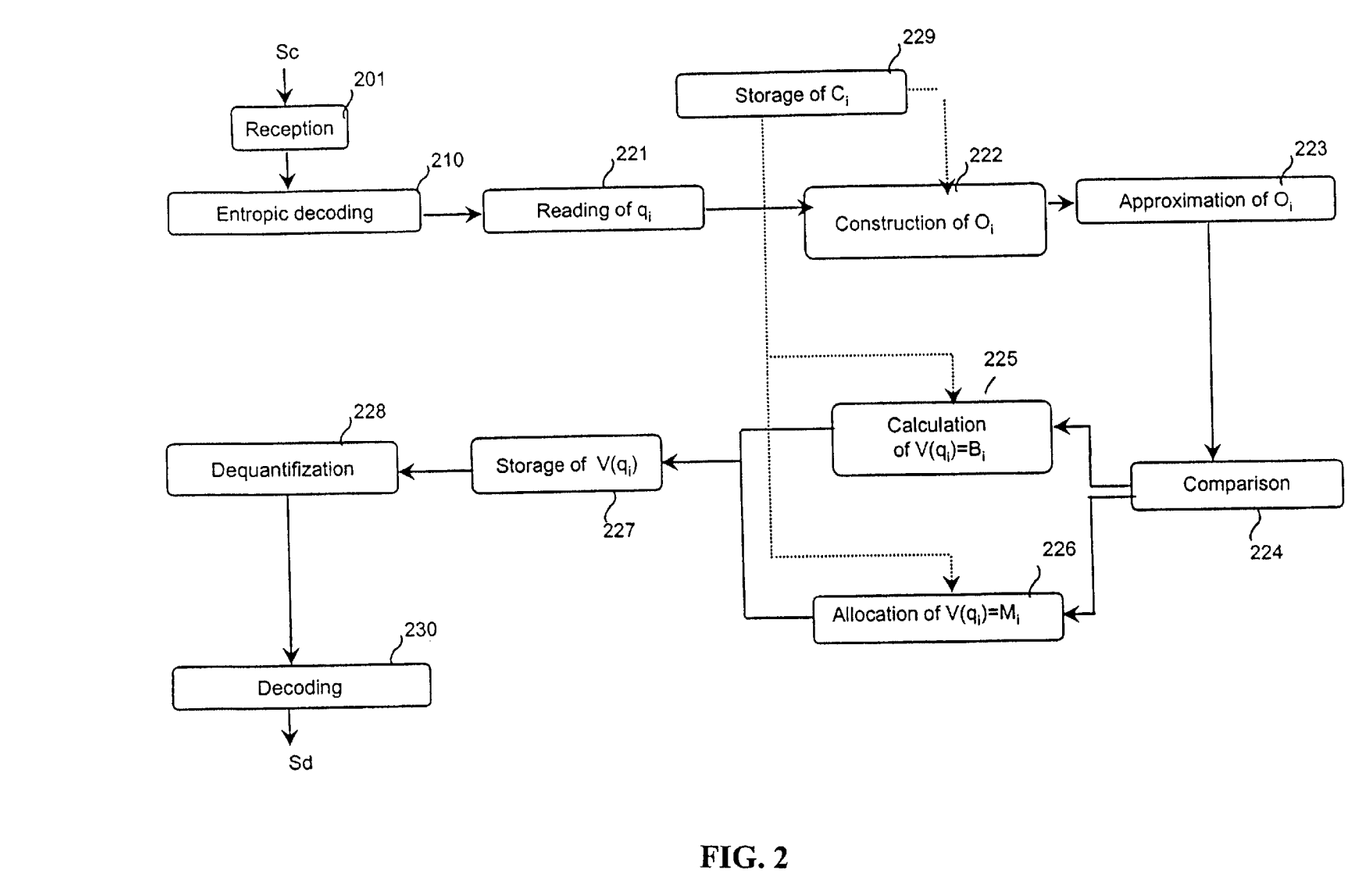
FIG. 2 is a block diagram illustrating an embodiment of a device or decoding a digital signal according to the invention.

As depicted in the example in FIG. 2, the decoding device 200 has more precisely reception means 201 for receiving the coded signal Sc and a conventional entropic decoding circuit 210.

The quantized signal is thus transmitted to the input of the dequantization means 220, which have successively, according to one embodiment of the invention:

means 221 of reading the quantization symbols $q_i$, for i varying from 1 to I, and I being equal to the number of quantization cells $C_i$;

means 222 of constructing an experimental distribution $O_i$ of the quantization symbols $q_i$ on the quantization cells $C_i$ by calculating the number of occurrences of the quantization symbols $q_i$ in the coded signal Sc;

approximation means 223 for approaching the experimental istribution $O_i$ by means of a continuous distribution model F, which is, for example, a real function with N variables, N corresponding to the dimension of the space to be quantized. This continuous distribution model F passes through values of the experimental distribution $O_i$, and preferably at the centre $M_i$ of each quantization cell $C_i$;

means 224 of comparing the number of occurrences $O_i$ of each quantization symbol $q_i$ with a threshold value T;

calculation means 225 adapted to calculate a dequantization vector $V(q_i)$ equal to the centre of mass $B_i$ of the points of a quantization cell $C_i$ weighted by the values of the continuous distribution F restricted to the quantization cell $C_i$;

allocation means 226 adapted to associate, with quantization symbols $q_i$, a dequantization vector $V(q_i)$ equal to the centre $M_i$ of the quantization cells $C_i$ associated with each quantization symbol $q_i$;

storage means 227 for storing the different dequantization vectors $V(q_i)$ associated with each quantization symbol $q_i$. These storage means can consist for example of a random access memory; and dequantization means 228 for dequantizing the signal, representing each vector of the signal Sc by a dequantization vector $V(q_i)$ associated with each quantization symbol received $q_i$.

Means 229 of storing in memory are provided for storing the form of the quantization cells $C_i$, that is to say when the space to be quantized is of dimension 1, the decision levels which make it possible to partition the space into quantization cells $C_i$.

All the means of reading 221, constructing 222, approximating 223, comparing 224, calculating 225, allocating 226, storing 227, dequantizing 228 and storing in memory 229 are implemented by means of a microprocessor associated with random access and read only memories. The read only memory contains a program according to the method in accordance with the invention for decoding the coded signal and one or more random access memories containing registers adapted to record variables modified during the running of the decoding program.

Figure 8:
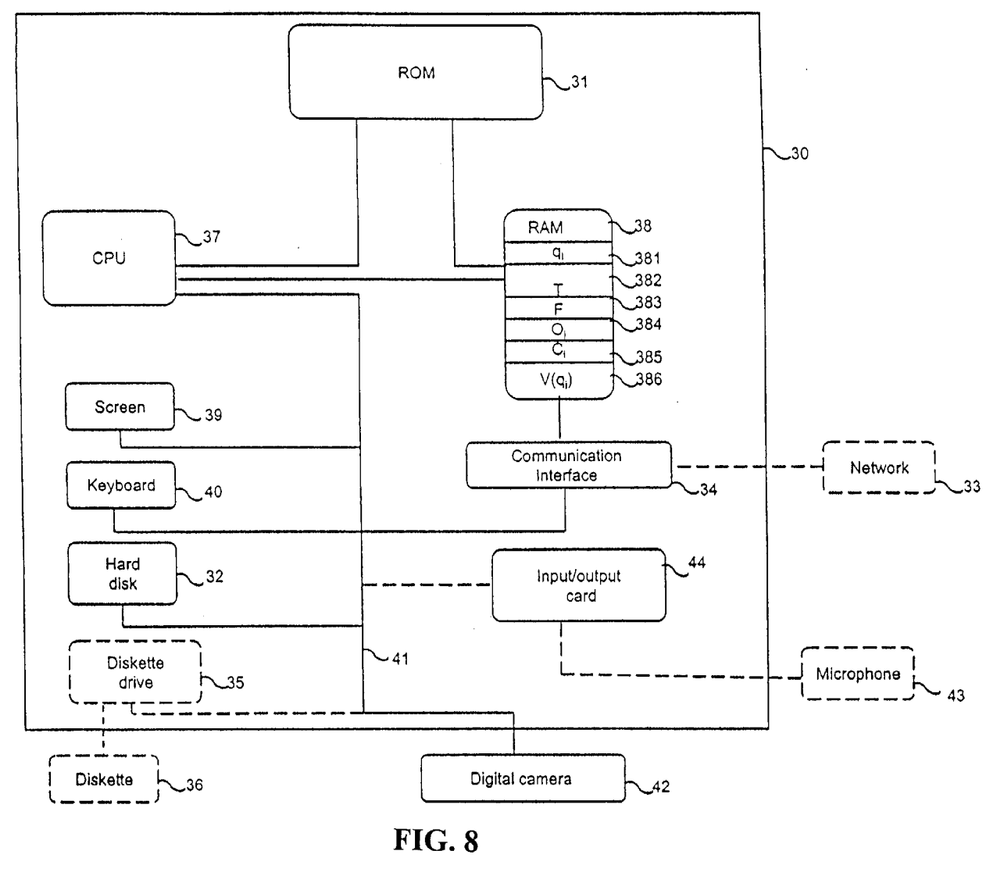
FIG. 8 is a block diagram illustrating a digital signal processing device adapted to implement the decoding method according to the invention.

As illustrated in FIG. 8 by way of example, the program can be stored in a read only memory (ROM) 31 of a computer 30 with the coding methods. It can also, as a variant, be stored in the hard disk 32 of the computer.

This decoding program can also be stored in whole or in part on a storage means which is removable and not integrated into the computer proper. Thus this decoding program, as well as the coding code, can be received and loaded into the read only memory 31 or the hard disk 32 by means of a communication network 33 connected to the computer by means of a communication interface 34. It can also be envisaged that the program be loaded by means of a disk drive 35 adapted to read the program instructions previously stored on a diskette 36. Naturally, the diskettes can be replaced by any information medium such as a fixed-memory compact disc (CD-ROM), a magnetic tape or a memory card.

In addition, it is possible to modify the coding or decoding method by adding new compression methods transmitted either by the communication network 33 or by a diskette 36.

A central unit 37 executes the instructions of the decoding program. Thus, on powering up, the compression and decoding programs and methods stored in one of the non-volatile memories, for example the read only memory 31, are transferred into a random access memory (RAM) 38 which will also contain the variables necessary to the implementation of the decoding method of the invention.

The random access memory 38 can contain notably several registers for storing the variables modified during the running of the program. Thus it has, by way of example, a register 381 for storing the quantization vectors $q_i$, a register 382 for storing the threshold value T, a register 383 for storing the approximation function F, a register 384 for storing the number of occurrences $O_i$ calculated, a register 385 for storing the form of the quantization cells $C_i$ and a register 386 for storing the dequantization vectors $V(q_i)$ associated with each quantization vector $q_i$.

The communication bus 41 affords, in a conventional fashion, communication between the different sub-elements of the computer.

The computer 30 also has a screen 39 for displaying the information to be compressed or serving as an interface with the user, who will be able to parameterize certain compression modes, by means of a keyboard 40 for example.

The data to be compressed can be supplied to the computer by different peripherals and notably a digital camera 42 connected to a graphics card, or a scanner or any other means of acquiring or storing images.

The communication network 33 can also be adapted to supply data to be compressed or to transmit a compressed digital signal. The diskette 36 can likewise contain compressed data.

As a variant, a microphone 43 is connected to the computer 30 by means of an input/output card 44. The data to be compressed will in this variant be an audio signal.

Figure 3:
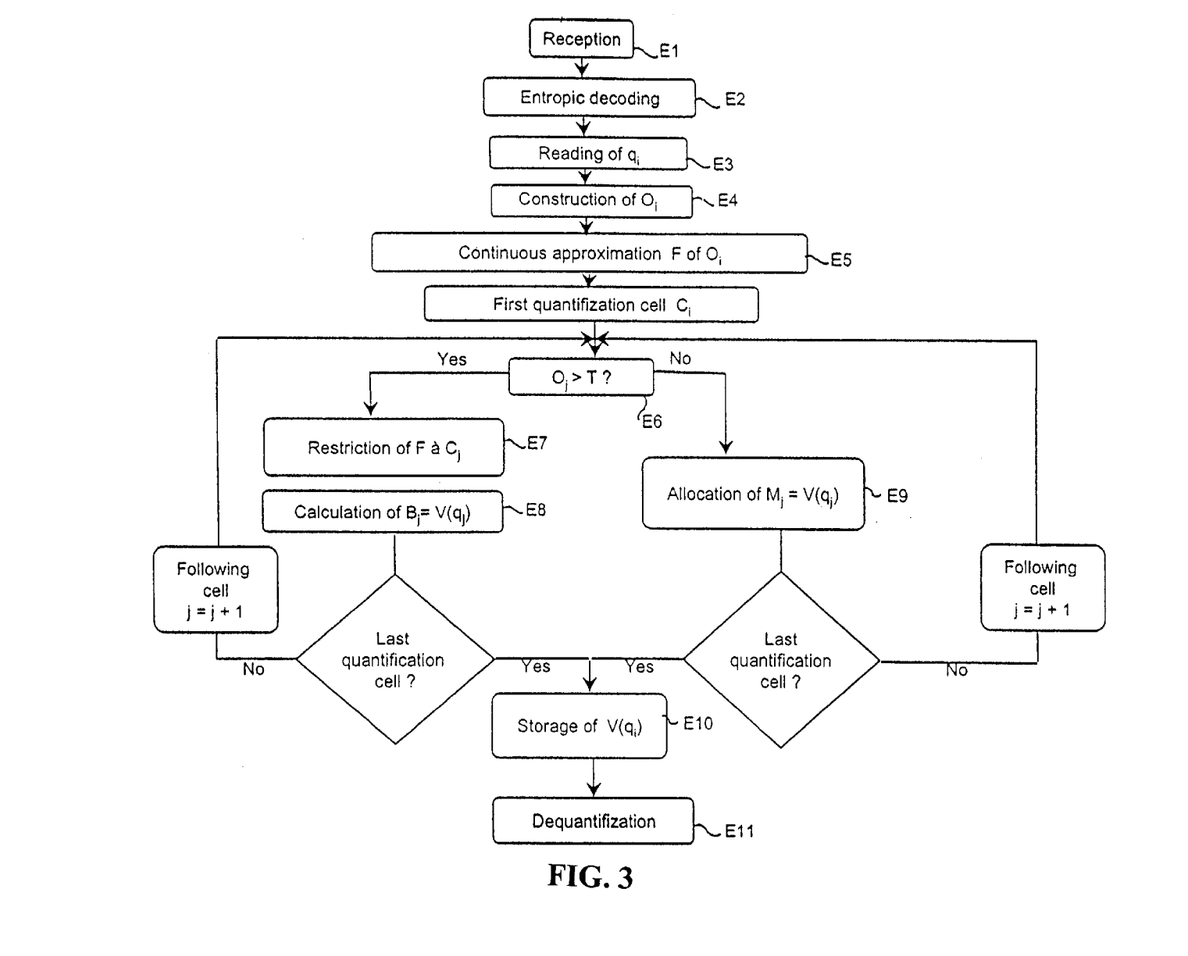
FIG. 3 is a decoding algorithm according to the invention.
Figure 5:
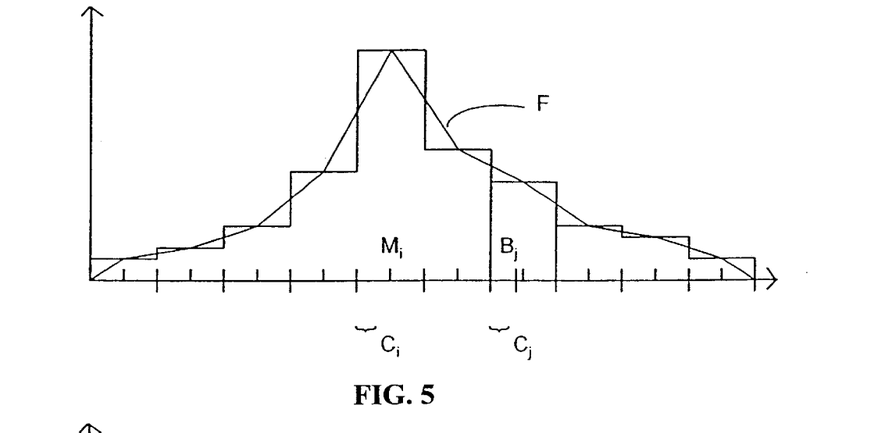
Figure 6:
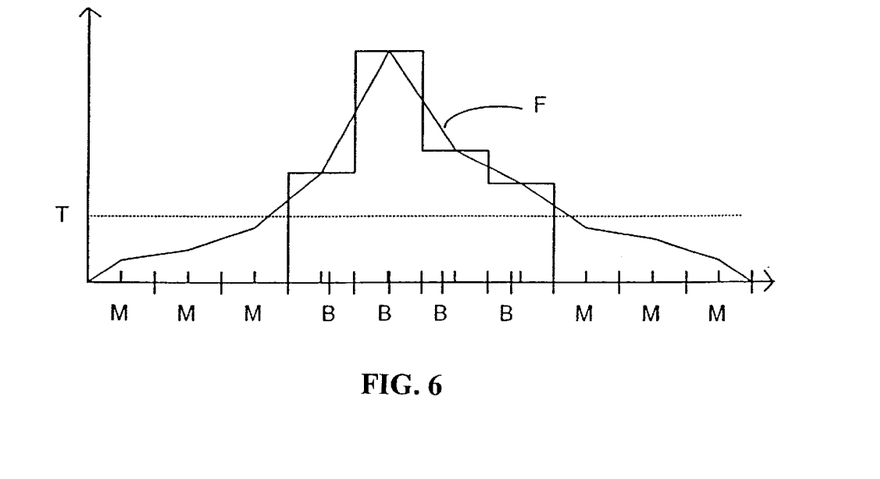

A decoding method according to one embodiment of the invention includes the steps shown diagramatically in FIG. 3. The implementation of this method will be described below with reference to FIGS. 4 to 6 illustrating different steps of the decoding method for a space of dimension 1, that is to say during the implementation of a scalar quantization and dequantization.

The coded signal Sc is received at step E1 and is previously decompressed, for example by means of an entropic decoding, at step E2.

According to the invention, the decoding method includes a step E3 of reading the quantization symbols $q_i$ of the coded signal Sc.

Figure 4:
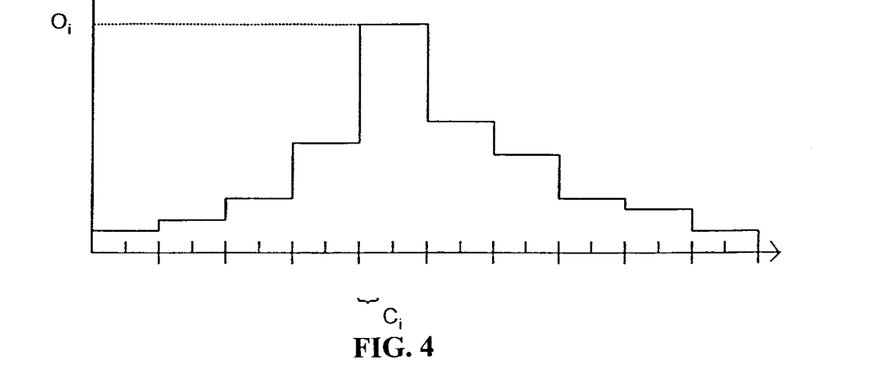
FIGS. 4, 5 and 6 are diagrams illustrating, for an example in dimension 1, the different steps of construction, approximation, calculation and allocation in a decoding method according to the invention.

From this data, the occurrence of each quantization symbol $q_i$ in the coded signal Sc is calculated and, at step E4, an experimental distribution $O_i$ of the quantization symbols on the quantization cells $C_i$ is constructed, as depicted in FIG. 4. The index i varies from 1 to I, I corresponding to the number of quantization cells $C_i$, here equal to 10.

In an approximation step E5, the experimental distribution $O_i$ is approached by means of a continuous distribution model F, this continuous distribution model passing through values of the experimental distribution. In this particular example, and as illustrated in FIG. 5, the continuous distribution F passes through the centre $M_i$ of each quantization cell $C_i$ and, in this example in dimension 1, this continuous distribution is a linear function by pieces passing through the centre $M_i$ of each quantization cell $C_i$.

In a comparison step E6, a first quantization cell $C_j$, j being between 1 and I, is considered and the number of occurrences $O_j$ of the quantization symbol $q_j$ associated with this cell $C_j$ is compared with a threshold value T.

If $O_j$ is greater than this threshold value T, in a calculation step E7 and E8, a dequantization vector is calculated, equal to the centre of mass $B_j$ of the points of the quantization cell $C_j$ weighted by the values of the continuous distribution on this quantization cell $C_j$. In step E7, the restriction of the continuous approximation F to the quantization cell $C_j$ is considered, as illustrated in FIG. 5, and, at step E8, the centre of mass $B_j$ is calculated with the continuous distribution values F restricted to the quantization cell $C_j$. In this way the dequantization vector $V(q_j)$ is obtained, equal to $B_j$ associated with the quantization symbol $q_j$.

A test is carried out to check whether all the quantization cells $C_i$ have been considered for calculating the dequantization vectors. In the negative, steps E6 et seq are reiterated for the following quantization cell $C_{j+1}$.

On the other hand, if, at step E6, $O_j$ is less than the threshold value T, at the allocation step E9 the value $M_j$ of the centre of the quantization cell $C_j$ is allocated as the dequantization vector $V(q_j)$. At the end of step E9, a test is also carried out to determine whether all the quantization cells $C_i$ have been considered and, in the negative, steps E6 et seq are reiterated for the following quantization cell $C_{j+1}$.

According to the invention, the decoding method also includes a step E10 of storing the dequantization vectors $V(q_i)$, equal either to the middle of the cell $M_i$, or to the centre of mass $B_i$, which were associated with each quantization symbol $q_i$ as illustrated in FIG. 6.

During the dequantization step E11, the coded signal Sc is dequantized by means of the stored dequantization vectors $V(q_i)$. In this way each vector of the signal Sc is represented by a dequantization vector $V(q_i)$ associated with the quantization symbol $q_i$ received.

A dequantized digital signal is then obtained, having a lower distortion than in a conventional dequantization using the centre of each quantization cell indifferently whatever the actual distribution of the signal on this quantization cell.

Figure 7:
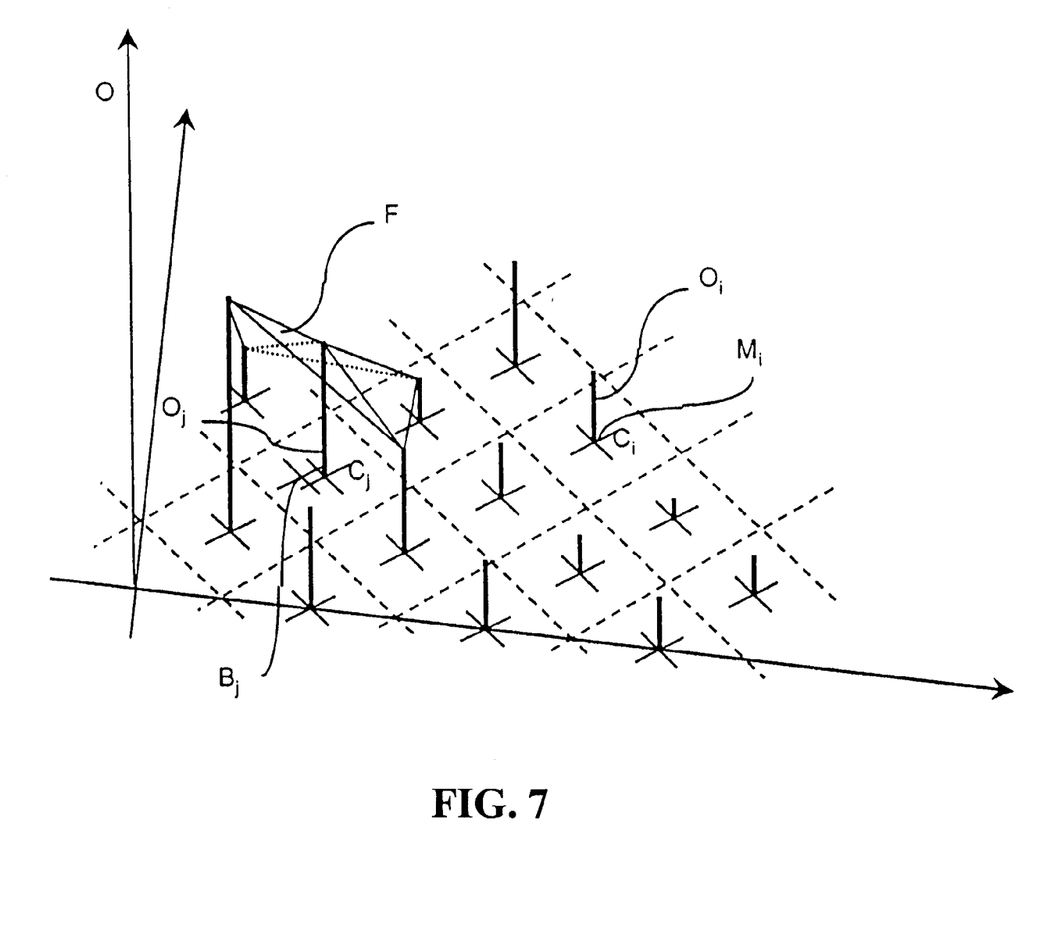
FIG. 7 is a diagram illustrating, for an example in dimension 2, the different steps of construction, approximation and calculation in a decoding method according to the invention.

FIG. 7 illustrates an example of the implementation of the decoding method according to the invention in a case where the quantization space is bi-dimensional. The quantization used in this example, during the coding of the digital signal, is of the Lattice Vector Quantization type. In this case, the quantization cells, depicted schematically in dotted lines in FIG. 7, form a regular partitioning of the dimension-2 quantization space.

Along an axis perpendicular to the plane of this space, the experimental distribution $O_i$ has been depicted, in a vertical continuous line, at the centre $M_i$ of each quantization cell $C_i$.

A relatively simple form of an approximation function F is a plane function by pieces, consisting of triangles with common boundaries and whose apexes correspond to the values of the experimental distribution $O_i$ at the centre $M_i$ of each quantization cell $C_i$.

Next, for each particular quantization cell $C_j$, j being between 1 and I, the centre of mass $B_j$ of the points of the quantization cell $C_j$ weighted by the values of the approximation function F restricted to this quantization cell $C_j$ is calculated.

As in the previous example, it is possible, at the boundaries of the quantization space, for which the number of occurrences $O_i$ of the quantization symbols $q_i$ is not significant, to associate, with these symbols $q_i$ a dequantization vector $V(q_i)$ equal to the centre $M_i$ of the quantization cell $C_i$.

Naturally, many modifications can be made to the examples described above without departing from the scope of the invention.

Thus the decoding device and method according to the invention can be used for decoding a digital signal representing a series of sounds.

In addition, it is possible for the decoding method not to include steps E6 of comparing the number of occurrences $O_i$ with a threshold value T and to associate, with each quantization symbol, a dequantization vector equal to the centre of mass of the points of the quantization cell weighted by the values of the continuous distribution. Correlatively, the decoding device in this case does not have comparison means 224 and allocation means 226.

What is claimed is:

1. A method of decoding a coded digital signal, the coded signal being quantized by means of quantization symbols associated respectively with quantization cells, said method comprising the steps of:

reading the quantization symbols;

constructing an experimental distribution of the quantization symbols on the quantization cells by calculating the number of occurrences of the quantization symbols in the coded signal;

approximating the experimental distribution by means of a continuous distribution model the continuous distribution model passing through values of the experimental distribution calculating, for at least one quantization cell, a dequantization vector equal to a center of mass of the points of the quantization cell weighted by values of the continuous distribution restricted to the quantization cell;

storing the dequantization vectors associated respectively with the quantization symbols; and dequantizing the coded signal, representing each vector of the signal by means of a dequantization vector associated with the quantization signal received.

2. A method according to claim 1, wherein the continuous distribution model passes through the values of the experimental distribution at the center of each quantization cell.

3. A method according to one of claims 1 or 2, further comprising the steps of:

comparing the number of occurrences of the quantization symbols with a threshold value;

calculating, for the quantization cells in which the number of occurrences of the quantization symbol is greater than the threshold value, a dequantization vector equal to the center of mass of the points of the quantization cell weighted by the values of the continuous distribution restricted to the quantization cell;

allocating, for the quantization cells in which the number of occurrences of the quantization symbol ($q_j$) is less than the threshold value, a dequantization vector equal to the center of the quantization cell;

storing the dequantization vectors associated respectively with the quantization symbols; and dequantizating the coded signal, representing each vector of the signal by the dequantization vector associated with the quantization symbol received.

4. A method according to one of claims 1 or 2, wherein the continuous distribution model is a real function with N variables, N being equal to the dimension of the quantization space.

5. A method according to claim 4, wherein the continuous distribution model is a linear function by pieces when the dimension of the quantization space is equal to one.

6. A method according to claim 4, wherein the continuous distribution model is a plane function by pieces when the dimension of the quantization space is equal to two.

7. A method according to one of claims 1 or 2, further comprising the step of entropic decoding.

8. A device for decoding a coded digital signal, the coded signal being quantized by means of quantization symbols associated respectively with quantization cells, comprising:

means for storing the a form of the quantization cells;

means for reading the quantization symbols;

means for constructing an experimental distribution of the quantization symbols on the quantization cells by calculating a number of occurrences of the quantization symbols in the coded signal;

means for approximating the experimental distribution ($O_i$) by means of a continuous distribution model, the continuous distribution model passing through values of the experimental distribution;

means for calculating a dequantization vector equal to a center of mass of points of the quantization cell weighted by the values of the continuous distribution restricted to the quantization cell ($C_i$);

means for storing the dequantization vectors associated respectively with the quantization symbols; and means for dequantizing the coded signal, adapted to represent each vector of the signal by means of a dequantization vector associated with the quantization signal received.

9. A device according to claim 8 wherein said approximation means uses a continuous distribution model passing through the values of the experimental distribution at the center of each quantization cell.

10. A device according to one of claims 8 or 9, further comprising:

means for comparing the number of occurrences of the quantization symbols with a threshold value, said calculation means being adapted to calculate a dequantization vector equal to the center of mass of the points of a quantization cell weighted by the values of the continuous distribution restricted to the quantization cell for the quantization cells in which the number of occurrences of the quantization symbol is greater than the threshold value; and allocation means adapted to associate, with the quantization symbols for which the number of occurrences of the quantization symbol is less than the threshold value, a dequantization vector equal to the center of the quantization cell.

11. A device according to one of claims 8 or 9, wherein the continuous distribution model is a real function with N variables, N being equal to the dimension of the quantization space.

12. A device according to claim 11, wherein the continuous distribution model is a linear function by pieces when the dimension of the quantization space is equal to one.

13. A device according to claim 11, wherein the continuous distribution model is a plan function by pieces when the dimension of the quantization space is equal two.

14. A device according to one of claims 8 or 9, wherein said means of storing in memory, reading, constructing, approximating, calculating, storing and dequantizing are incorporated in:

a microprocessor, a read only memory containing a program for decoding the coded signal, and a random access memory containing registers adapted to record variables modified during the running of the program.

15. A device according to claim 10, wherein said means of storing in memory, reading, constructing, approximating, comparing, calculating, storing, dequantizing and allocation means are incorporated in:

a microprocessor, a read only memory containing a program for decoding the coded signal, and a random access memory containing registers adapted to record variables modified during the running of the program.

* * * * *

UNITED STATES PATENT AND TRADEMARK OFFICE
CERTIFICATE OF CORRECTION

PATENT NO. : 6,208,272 B1
DATED : March 27, 2001
INVENTOR(S) : Henry

It is certified that error appears in the above-identified patent and that said Letters Patent is hereby corrected as shown below:

Sheet 2,
Fig. 2, in block 228, "Dequantifization" should read -- Dequantization --.

Sheet 3,
Fig. 3, in the block following block E5, "quantifization" should read -- quantization -- and in block E11, "Dequantifization" should read -- Dequantization --.

Column 1,
Line 35, "et" should read -- and --.

Column 2,
Line 43, "dequantizating" should read -- dequantizing --.

Column 5,
Line 8, "istribution" should read -- distribution --.

Column 7,
Line 26, "El 1," should read -- E11 --.

Column 8,
Line 20, "model" should read -- model, --;
Line 22, "distribution" should read -- distribution; -- and
Line 52, "dequantizating" should read -- dequantizing --.

Column 9,
Line 25, "claim 8" should read -- claim 8, --.

Signed and Sealed this

Twenty-sixth Day of March, 2002

Attest:

JAMES E. ROGAN
*Attesting Officer*     *Director of the United States Patent and Trademark Office*